United States Patent
Zhu et al.

(10) Patent No.: US 8,352,837 B1
(45) Date of Patent: Jan. 8, 2013

(54) SYSTEM AND METHODS FOR STORING DATA ENCODED WITH ERROR INFORMATION IN A STORAGE MEDIUM

(75) Inventors: Jun Zhu, San Jose, CA (US); Peter Tze-Hwa Liu, Alameda, CA (US); Joseph Jun Cao, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 323 days.

(21) Appl. No.: 12/723,194

(22) Filed: Mar. 12, 2010

Related U.S. Application Data (60) Provisional application No. 61/161,987, filed on Mar. 20, 2009.

(51) Int. Cl.
*H03M 13/00* (2006.01)
(52) U.S. Cl. .......... 714/776; 714/774; 714/758
(58) Field of Classification Search .......... 370/313; 371/37.1; 714/755, 777, 758; 375/296
See application file for complete search history.

(56) References Cited

U.S. PATENT DOCUMENTS

| | | | | |
|---|---|---|---|---|
| 5,488,617 | A * | 1/1996 | Van Driel | 714/753 |
| 5,652,783 | A * | 7/1997 | Keba et al. | 370/313 |
| 6,230,297 | B1 * | 5/2001 | Bentall et al. | 714/758 |
| 7,103,829 | B2 * | 9/2006 | Van Dijk et al. | 714/777 |
| 7,493,550 | B1 * | 2/2009 | Kou et al. | 714/777 |
| 7,958,426 | B2 * | 6/2011 | Betts | 714/755 |
| 8,069,391 | B1 * | 11/2011 | Wu et al. | 714/758 |

* cited by examiner

*Primary Examiner* — M. Mujtaba K Chaudry

(57) ABSTRACT

System and methods for storing data encoded with error information in a storage medium are provided. A binary data and an encoded binary error signals are received. The encoded binary error signal includes information that represents occurrence of errors in the binary data signal. The binary data and encoded binary error signals are encoded to generate a binary codeword signal. Bits of the binary codeword signal that represent coding information and the binary data signal are extracted. The extracted bits of the binary codeword signal are stored in a first storage medium. The binary packed data signal is retrieved from the first storage device and decoded to recover the binary data signal and a syndrome. Error information corresponding to the encoded binary error signal may be determined based on the syndrome.

20 Claims, 5 Drawing Sheets

SYSTEM AND METHODS FOR STORING DATA ENCODED WITH ERROR INFORMATION IN A STORAGE MEDIUM

CROSS-REFERENCE TO RELATED APPLICATION

This application claims the benefit under 35U.S.C. §119(e) of U.S. Provisional Application No. 61/161,987, filed Mar. 20, 2009 which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Traditional memory controllers in storage systems receive data signals as well as error signals that provide parity and forwarded errors information associated with the data. In particular, the forwarded errors information typically indicate errors that occur in the transmission medium through which the data is provided to the memory controller. The traditional memory controllers inefficiently use the memory because the controllers store the received data and error signals in their entirety, or interrupt the central processing unit (CPU) to handle the errors. The former requires extra storage and the latter lowers down the system performance.

SUMMARY

In view of the foregoing, systems and methods for storing data encoded with error information in a storage medium in accordance with various embodiments of the present disclosure are provided.

In some embodiments, a binary data signal and an encoded binary error signal are received. The encoded binary error signal includes information that represents occurrence of errors in the binary data signal. The binary data signal and encoded binary error signal in combination represent a first number of bits. The binary data and encoded binary error signals are encoded to generate a binary codeword information signal. Portions of the binary codeword information signal that include coding information and the binary data signal are extracted. The extracted portions of the binary codeword information signal represent a second number of bits that is less than the first number of bits. The extracted portions of the binary codeword information signal are stored in a first storage medium.

In some embodiments, the stored binary codeword information signal is retrieved from the first storage medium. The retrieved binary codeword information signal is decoded using a linear error-correcting code algorithm to provide a decoded binary data signal and a binary syndrome signal. Parity information bit included in the binary codeword information signal is obtained. The binary syndrome signal and the parity information bit are processed to detect (1) whether errors occurred after the binary data signal and an encoded binary error signal have been received and (2) whether the encoded binary error signal represented occurrence of errors in the binary data signal.

In some implementations, when the processing detects that the encoded binary error signal represented occurrence of errors in the binary data signal, recovered error information signal that corresponds to a binary error signal received prior to the encoding is retrieved from a storage location in a second storage medium, based on a value represented by the binary syndrome signal. The recovered error information signal includes previously received forwarded error information and parity information associated with the decoded binary data signal.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which.

DETAILED DESCRIPTION

The present disclosure generally relates to storing data with encoded error information in storage devices. For illustrative purposes, the present disclosure will be described in the realm of a 64-bit data signal and a 56-bit encoded error signal that are encoded/decoded using a Hamming code algorithm but it should be understood that the present disclosure is applicable to any data signal and error signal that is of any size and which is encoded/decoded using any suitable coding algorithm.

Figure 1:
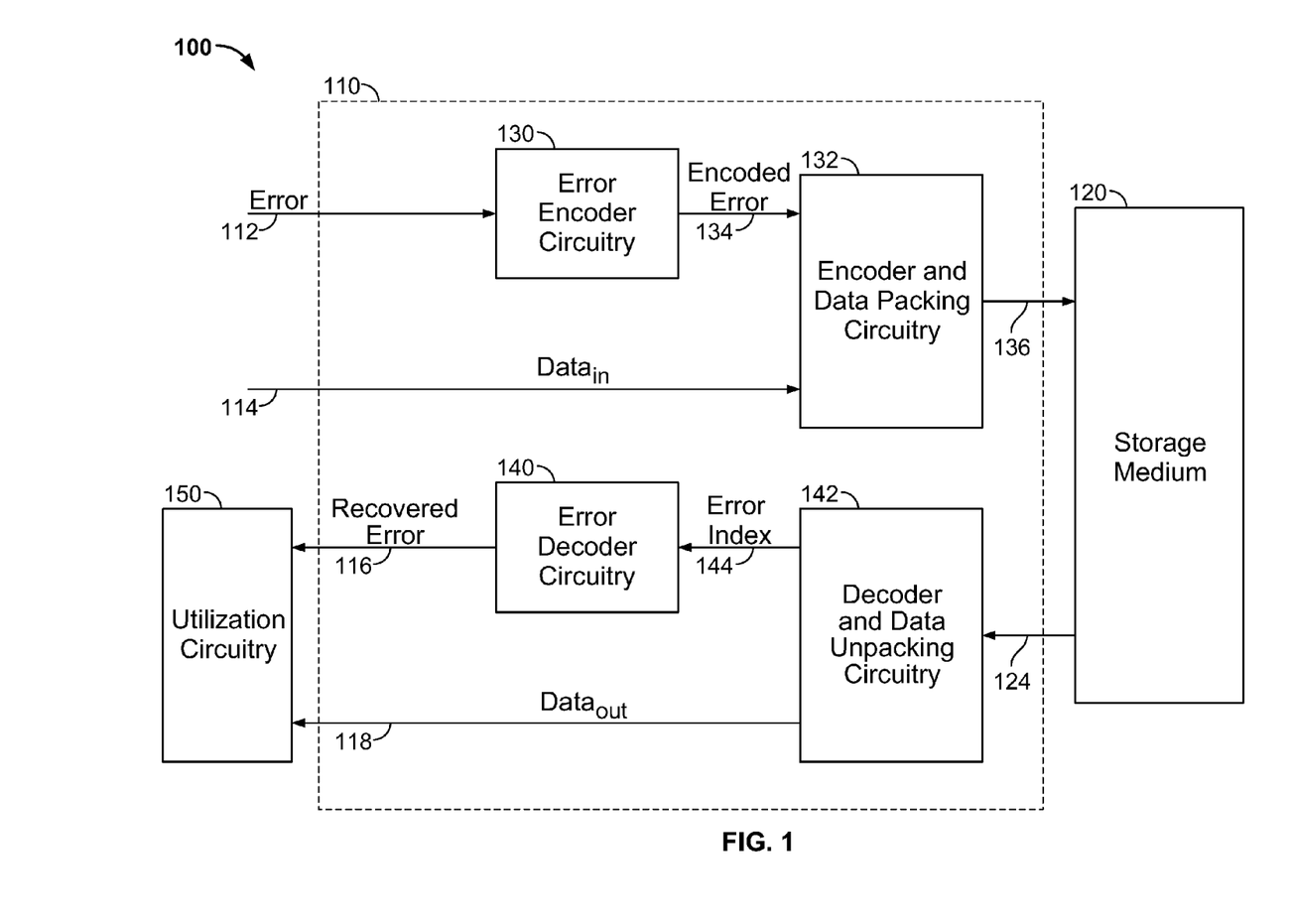
FIG. 1 shows an illustrative memory system for storing data with encoded error information in accordance with an embodiment of the present disclosure.

FIG. 1 shows an illustrative memory system 100 for storing data with encoded error information in accordance with an embodiment of the present disclosure. System 100 includes a memory controller 110, a storage medium 120 and utilization circuitry 150. Memory controller 110 may receive a binary data signal 114 and binary error signal 112. Memory controller 110 may encode binary error signal 112 using error encoder circuitry 130 and execute an encoding algorithm using encoded binary error signal 134 and binary data signal 114 to generate a codeword. Memory controller 110 may extract portions of the codeword that include coding information and binary data signal 114 information and store the extracted portions to storage medium 120. The total size of extracted portions of the codeword may represent less bits or may be smaller than the total size of binary data signal 114 and binary error signal 112 or the encoded binary error signal 134. Since the coding information was generated based on both binary data signal 114 and encoded binary error signal 134, the coding information represents both the binary data signal information and the encoded error signal information. Accordingly, when the extracted portions are decoded using the stored coding information, a determination may be made as to the value of encoded error signal 134 even though the actual values of encoded error signal 134 is not stored to storage medium 120.

When memory controller 110 retrieves the packed data signal, memory controller 110 may decode the packed data signal to generate a syndrome which may be used to recover binary error signal 112 which was received by memory controller 110 but was not stored with binary data signal 114. Accordingly, instead of storing the binary data signal 114 with binary error signal 112, a codeword is generated for storage which allows for the identification of the previously received binary error signal without ever storing binary error signal 112. In some embodiment, memory controller 110 may correct single bit errors in binary data signal 118 that is recovered and detect two-bit errors in binary data signal 118 that is recovered.

Binary data signal 114 may be provided by another component in the system such as a motherboard, central processing unit, external device and/or utilization circuitry 150. In some implementations, binary data signal 114 may represent 64-bits of binary data. The number of bits represented by binary data signal 114 may depend on the size and type of storage medium 120 that is used. Binary error signal 112 may include information identifying the occurrence of parity and forwarded errors in binary data signal 114. In some implementations, binary error signal 112 may represent 6-bits of binary error information. The number of bits represented by binary error signal 112 may vary based on error correction and/or detection algorithms implemented by utilization circuitry 150 that will ultimately receive the retrieved data or the error correction and/or detection algorithms implemented by the device which provides the binary data signal 114. Some of the bits (e.g., 2-bits) of binary error signal 112 may correspond to forwarded errors (e.g., errors corresponding to the underlying transmission medium in which the data was provided) and the remaining bits (e.g., 4-bits) of binary error signal 112 may correspond to parity error bits (e.g., redundancy bits added by the unit or utilization circuitry 150 providing binary data signal 114).

In some embodiments, memory controller 110 may be configurable or programmable. In particular, memory controller 110 may be configured or programmed to implement the teachings of this disclosure based on any size binary data signal 114 or binary error signal 112. For example, memory controller 110 may be configured or programmed to operate and receive a binary data signal that represents 128-bits of data and a binary error signal that represents 7-bits of error information. More specifically, memory controller 110 may be configured or programmed to operate based on the type and size of storage medium 120. In some implementations, memory controller 110 may be implemented by any one or combination of a field programmable gate array (FPGA), application specific integrated circuit (ASIC) and programmable logic device (PLD).

In some embodiments, storage medium 120 may be a magnetic storage medium or magnetic recording channel such as a hard disk drive or floppy drive or holographic storage device. In some implementations, storage medium 120 may be an optical storage device such as a CD-ROM, Blu-Ray, or HD Drive. In some implementations, storage medium 120 may be any MOS or CMOS storage device such as a RAM, ROM, SDRAM, SRAM, DDR1, DDR2, DDR3, LPDDR1, LPDDR2 memory or other suitable memory device. In some implementations, storage medium 120 may include any combination of magnetic, optical, holographic and silicon based storage medium.

Utilization circuitry 150 may include various analog or digital processing circuitries. For example, utilization may be a digital signal processor or a microprocessor or central processing unit (CPU). In some implementations, utilization circuitry 150 may include transmitter/receiver circuitry. In some embodiments, utilization circuitry 150 may provide control signals to any one of the components of system 100 to execute, change or modify the encoding/decoding, storing and retrieving memory operations.

In some embodiments, memory controller 110 may include error encoder circuitry 130, encoder and data packing circuitry 132, decoder and data unpacking circuitry 142 and error decoding circuitry 140. Error encoder circuitry 130 may receive and encode binary error signal 112 and output an encoded binary error signal 134. In some implementations, encoded binary error signal 132 may be an all zero or one-hot representation of binary error signal 112. A one-hot signal is a signal that represents a certain number of bits (e.g., 56-bits) where only one of the certain number of bits in a particular position has a value of '1'. For example, a one-hot signal representing 5-bits may have the single bit at the second position valued at one (e.g., "01000"). In some implementations, encoded binary error signal 132 may represent 56 bits of information. In particular, error encoder circuitry 130 may include a memory or look-up table which may store different one-hot signals and an all zero signal.

In some embodiments, encoder circuitry 130 may include a memory where at each subsequent memory address location, the bit of the one-hot signal that is valued at '1' may be advanced by one bit. For example, memory address location "001" may include a one-hot signal having the value "00001" and subsequent memory address location "010" may include a one-hot signal having the value "00010". In some implementations, the one-hot signals stored in the memory of encoder circuitry 130 are all unique and do not repeat such that no two signals stored in the memory of encoder circuitry 130 represent binary signals having the same value. It should be understood, that any other arrangement of the one-hot signals in the memory or look-up table of encoder circuitry 130 may be provided. In some implementations, binary error signal 112 may be used to address a memory storage location of encoder circuitry 130. The contents stored at the memory storage location addressed by binary error signal 112 may be output as encoded binary error signal 134.

Encoder and data packing circuitry 132 may receive encoded binary error signal 134 and binary data signal 114. Encoder and data packing circuitry 132 may generate a codeword based on encoded binary error signal 134 and binary data signal 114. In some implementations, the codeword may be generated using a linear error correcting code algorithm (e.g., Hamming code). In some embodiments, the codeword may represent 127-bits of information including 7-bits of coding information and 64-bits of binary data signal 114 and 56-bits of encoded error signal 134. Encoder and data packing circuitry 132 may extract a portion (e.g., a first number of bits) of the codeword that includes bits representing coding information interleaved with bits representing binary data signal 114 and add parity information (e.g., 1-bit of parity) to the extracted portion. Encoder and data packing circuitry 132 outputs the packed signal 136 to storage medium 120.

Figure 2:
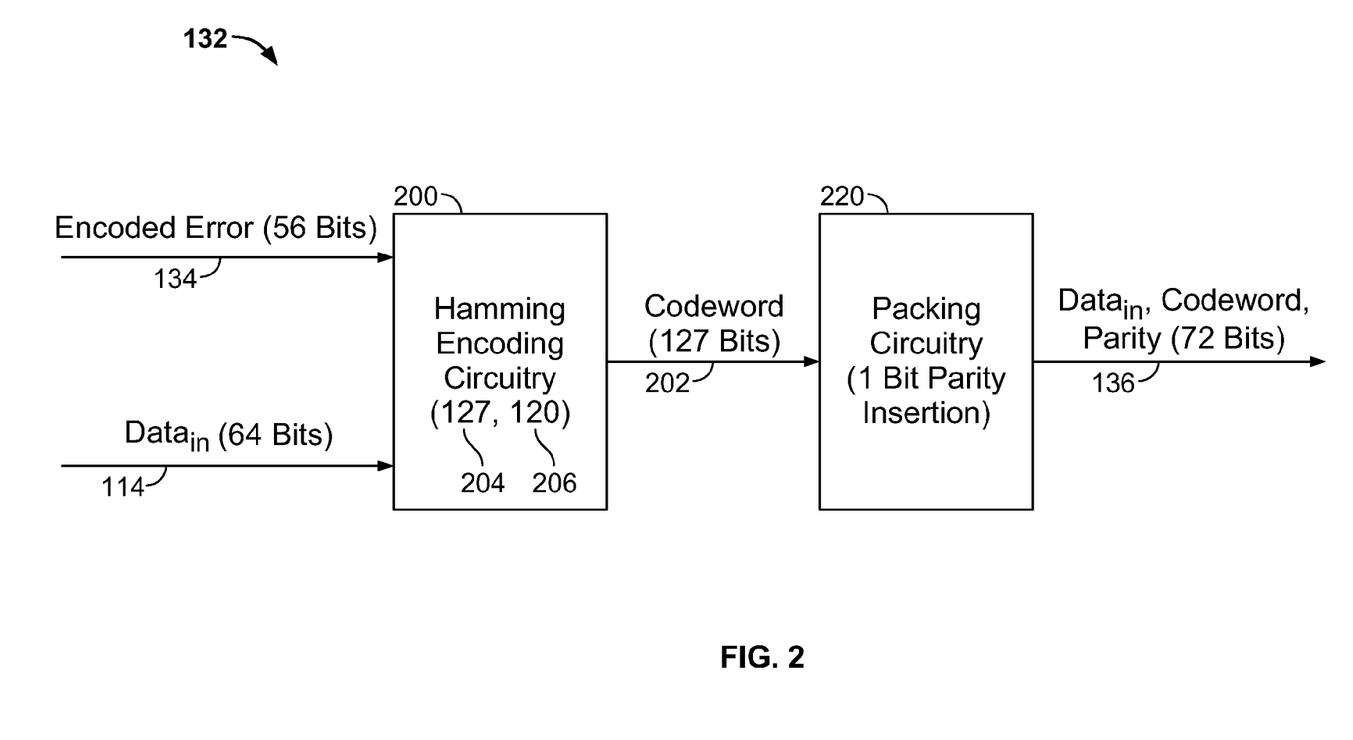
FIG. 2 shows an illustrative encoder and data packing circuitry in accordance with an embodiment of the present disclosure.

FIG. 2 shows an illustrative encoder and data packing circuitry 132 in accordance with an embodiment of the present disclosure. Encoder and data packing circuitry 132 may include Hamming encoding circuitry 200 and packing circuitry 220. Hamming encoding circuitry 200 may execute an algorithm of the Hamming linear error correcting code. In particular, Hamming encoding circuitry 200 may receive 120-bits of information (e.g., 64-bits of binary data signal 114 and 56-bits of encoded error signal 134) and may output a codeword signal 202 that includes 7-bits of coding information in addition to the 120-bits of information Hamming encoding circuitry 200 receives. As shown, Hamming encoding circuitry 200 performs an algorithm that has input 206 a signal with a size 206 of 120-bits and outputs a codeword having a size 204 of 127-bits.

In some implementations, Hamming encoding circuitry 200 may generate codeword signal 202 by generating an codeword signal E[1:127] having initial values for the coding bits from binary data signal 114 and encoded error signal 134. To generate the codeword signal E[1:127], Hamming encoding circuitry 200 may first append the bits represented by encoded error signal 134 to the bits represented by binary data signal 114 to create signal D[1:119]. Hamming encoding circuitry 200 may then add seven coding bits each with a value of '0' at bit positions 1, 2, 4, 8, 16, 32 and 64. In particular, each subsequent bit of the coding bits may be inserted in each location of $2^n$ of D[1:119]. The resulting initial codeword signal E[1:127] may have bits of the data signal, encoded error signal and coding information arranged as follows:

E[1:127]=C[0], C[1], D[0], C[2], D[1], D[2], D[3], C[3], D[4], . . . , D[10], C[4], D[11], D[12], . . . D[25], C[5], D[26], D[27], . . . , D[56], C[6], D[57], D[58], . . . , D[63], M[0], M[1], . . . , M[55];

where C[0:6] represent the coding information bits, D[0:63] represent bits of binary data signal 114 and M[0:55] represent bits of binary encoded error signal 134 (e.g., a one-hot signal).

The coding bits of E[1:127] may be computed using an iterative loop. An index value may be initialized to 1 (e.g., i=1) and incremented by 1 at the end of each iteration up until the value of the index is equal to 127. During each iteration C[0:6] is computed as follows:

C[0]=C[0] XOR E[i], when i&1==1;
C[1]=C[1] XOR E[i], when i&2==2;
C[2]=C[2] XOR E[i], when i&4==4;
C[3]=C[3] XOR E[i], when i&8==8;
C[4]=C[4] XOR E[i], when i&16==16;
C[5]=C[5] XOR E[i], when i&32==32; and
C[6]=C[6] XOR E[i], when i&64==64 where XOR represents a logic XOR operation and '&' represents a logic AND operation. The index is incremented at the end of each iteration and the loop continues until the index reaches the value of 127. After performing all the iterations of the loop, C[0:6] represent the coding information in the final codeword signal T[1:127]. Hamming encoding circuitry 200 may output T[1:127] as codeword signal 202. In some embodiments, the size of the codeword or coding information may vary based on the size or number of bits in binary encoded error signal 134 and binary error signal 112.

In some embodiments, packing circuitry 220 may receive codeword signal 202 and compute parity information for codeword signal 202. In some implementations, packing circuitry 220 may compute the parity information to be added to each bit in codeword signal 202 (e.g., performing an XOR operation between each bit of codeword signal 202). For example, packing circuitry 220 may compute T[0] XOR T[1] XOR T[2] . . . XOR T[127] to compute the parity information. Any other suitable method of computing parity information that includes one or more parity bits may be used in computing parity information of codeword signal 202. More parity bits of information may be provided to allow for error correction or detection of more bits of information.

Packing circuitry 220 may extract portions of codeword signal 202 that correspond to the coding information (e.g., C[0:6]) and binary data signal 114 and combine the resulting signal with the parity information. In particular, packing circuitry 220 may extract portions of codeword signal 202 that do not include bits corresponding to binary encoded error signal 134. For example, packing circuitry 220 may extract from codeword signal 202 T[1:127] the first 71 bits of information which include bits corresponding to binary data signal 114 interleaved with coding information at $2^n$ positions of T[1:127]. In some implementations, packing circuitry 220 may append either at the beginning of the extracted portions or at the end or at some other suitable position the computed parity information (e.g., the parity bit or bits). The resulting packed signal 136 which includes the extracted portions of the codeword signal and the parity information may be stored in storage medium 120. The total number of bits in the extracted portions of codeword signal 202 with the parity information addition may be less than the total number of bits represented by binary data signal 114 and binary encoded error signal 134.

Referring back to FIG. 1, memory controller 110 may retrieve from storage medium 120 the packed signal 136 as retrieved signal 124. Memory controller 110 may provide the retrieved packed signal 136 to decoder and data unpacking circuitry 142. Decoder and data unpacking circuitry 142 may process the parity information in the retrieved packed signal 136 to detect occurrence of errors and remove the parity information from packed signal 136. Decoder and data unpacking circuitry 142 may decode packed signal 136 without the parity information using a linear coding algorithm (e.g., Hamming decoding algorithm) to generate a syndrome which may represent encoded error signal 134 and recover data signal 114. When decoder and data unpacking circuitry 142 determines that no errors in the packed signal 136 exist or is able to correct errors in packed signal 136 that are present, decoder and data unpacking circuitry 142 may output the recovered data signal as data output signal 118 and may recreate encoded error signal 134 from the generated syndrome for output to error decoder circuitry 140 as error index signal 144. In some implementations, error index signal 144 may be the same as encoded error signal 134. In particular, the syndrome represents an error location in the encoded signal. Moreover, data signal 114 was encoded together with encoded error signal 134 (which is an all zero or one-hot signal) but only the data part of the encoded information was stored in memory. Accordingly, when decoder and data unpacking circuitry 142 decodes the encoded information that was stored, the syndrome generated by decoder and data unpacking circuitry 142 identifies an error in the encoded information at the location where the bit of the encoded error signal 134 (e.g., the one-hot signal) was when the information was encoded. More specifically, error is intentionally created or put in the codeword signal (e.g., by extracting and storing only the code information and data information and excluding the encoded error information) which is generated based on the data and encoded error information. The codeword signal with the error is stored and when the codeword signal with the error is decoded, the decoder identifies the error in the codeword by generating the syndrome which is used to recover the error information which was encoded.

Error decoder circuitry 140 may be the same or similar as error encoder circuitry 130. In some implementations, error decoder circuitry 140 may share circuitry with error encoder circuitry 130. It should be understood that although error decoder circuitry 140 and error encoder circuitry 130 are drawn as two components, error decoder circuitry 140 may be the same component as error encoder circuitry 130. In particular, error decoder circuitry 140 may be a look-up table where error index signal 144 may be used to determine the address location corresponding to the data of error index signal 144. More specifically, error index signal 144 may be a one-hot or an all zero signal which may be the data stored in error decoder circuitry 140. Error decoder circuitry 140 may perform a reverse look-up based on error index signal 144 to determine and output as recovered error signal 116 the address location in which the data of error index signal 144 is stored.

In some embodiments, error decoder circuitry 140 may be a memory in which binary error signal 112 is stored and retrieved based on an address provided by error index signal 144. In particular, error decoder circuitry 140 may include a memory which has stored at an address location corresponding to each entry or data storage location of error encoder circuitry 130, the value of binary error signal 112 that addresses the entry or data storage location of error encoder circuitry 130. For example, error encoder circuitry 130 may have a memory where at the addresses "001" and "011" the respective data values of "00001" and "01000" are stored and error decoder circuitry 140 may have a memory where at addresses "00001" and "01000" the respective data values of "001" and "011" are stored.

Figure 3:
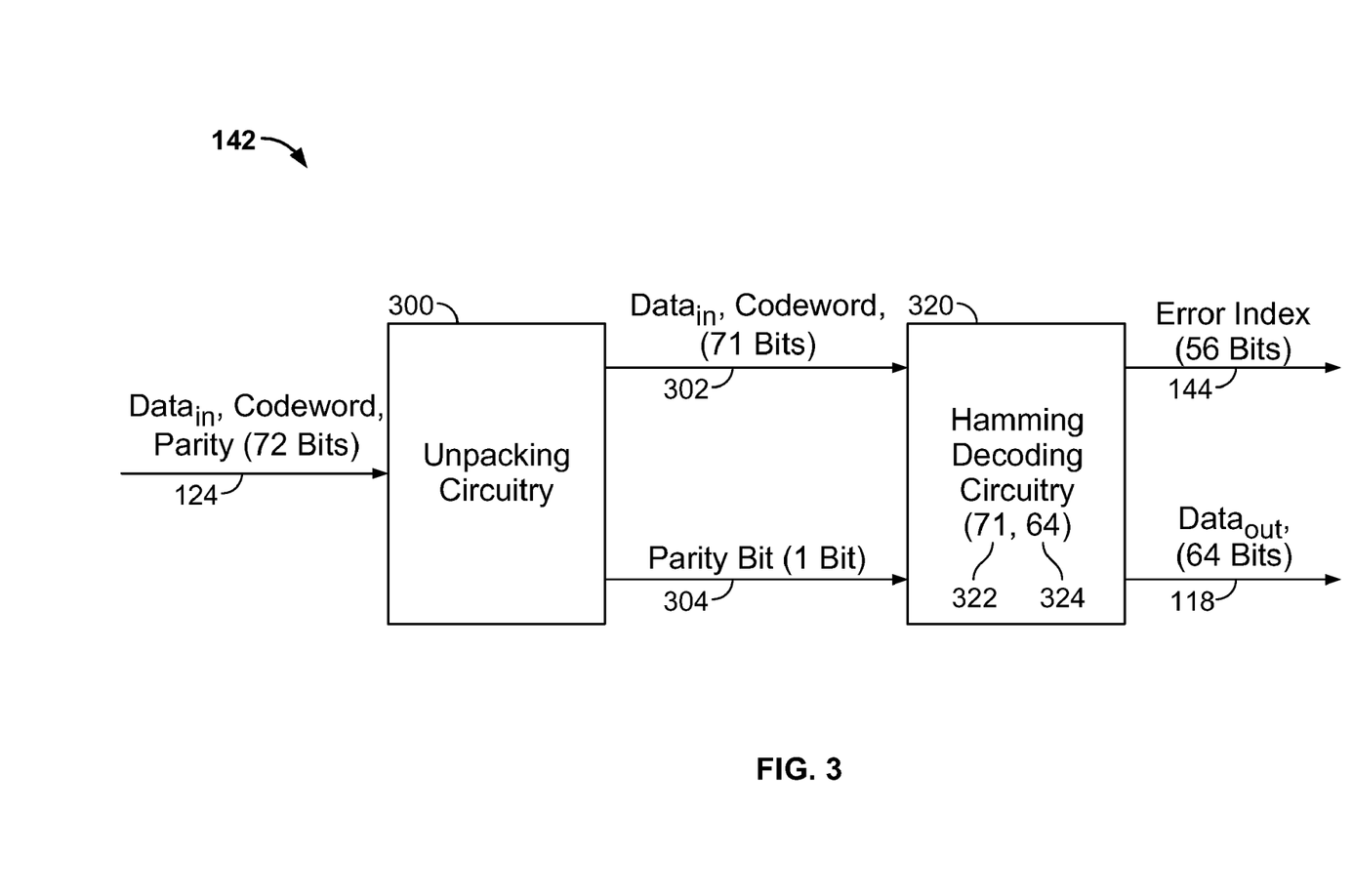
FIG. 3 shows an illustrative decoder and data unpacking circuitry in accordance with an embodiment of the present disclosure.

FIG. 3 shows an illustrative decoder and data unpacking circuitry 142 in accordance with an embodiment of the present disclosure. Decoder and data unpacking circuitry 142 may include Hamming decoding circuitry 320 and unpacking circuitry 300. Unpacking circuitry 300 may process the retrieved signal 124 to detect parity errors by computing parity information and comparing the computed parity information with the parity information included in retrieved signal 124. In some implementations, unpacking circuitry 300 may compute the parity information by adding each bit (excluding the parity information bit(s)) in retrieved signal 124 with each other (e.g., performing an XOR operation between each bit of retrieved signal 124). Any other suitable method of computing parity information that includes one or more parity bits may be used in computing parity information of retrieved signal 124. The computed parity information may then be compared with the parity information bit in retrieved signal 124 to detect parity errors. The result of the comparison and/or the computed parity information may be provided as signal 304 to hamming decoding circuitry 320.

Hamming decoding circuitry 320 may execute an algorithm of the Hamming linear error correcting code. In particular, Hamming decoding circuitry 320 may receive 71-bits of information (e.g., the retrieved data and codeword signals) and may output a decoded data signal 118 and a syndrome as error index signal 144. As shown, Hamming decoding circuitry 320 performs an algorithm that receives as input 302, a signal with a size 322 of 71-bits, and outputs a data signal having a size 324 of 64-bits and a 56-bit error index signal. Hamming decoding circuitry 320 may receive parity information 304 from unpacking circuitry 300. Hamming decoding circuitry 320 may determine based on the parity information whether errors in retrieved signal 124 are correctable and based on that determination generate error index signal 144 from the syndrome.

In some implementations, Hamming decoding circuitry 320 may compute or generate the syndrome in the same or similar manner as Hamming encoding circuitry 200 computes or generates codeword signal 202 (FIG. 2). In some embodiments, Hamming decoding circuitry 320 may share circuitry with Hamming encoding circuitry 200 to reduce chip space. In particular, the bits of the syndrome S[6:0] may be computed based on input 302 R[0:71] using an iterative loop. Input 302 as discussed above may include the information retrieved from memory which includes extracted portions of codeword signal 202 including the data signal and coding information. An index value may be initialized to 1 (e.g., i=1) and incremented by 1 at the end of each iteration up until the value of the index is equal to 127. During each iteration S[0:6] is computed as follows:

S[0]=S[0] XOR R[i], when i&1==1;
S[1]=S[1] XOR R[i], when i&2==2;
S[2]=S[2] XOR R[i], when i&4==4;
S[3]=S[3] XOR R[i], when i&8==8;
S[4]=S[4] XOR R[i], when i&16==16;
S[5]=S[5] XOR R[i], when i&32==32; and
S[6]=S[6] XOR R[i], when i&64==64 where XOR represents a logic XOR operation and '&' represents a logic AND operation. The index is incremented at the end of each iteration and the loop continues until the index reaches the value of 127. After performing all the iterations of the loop, the computed S[0:6] represents the syndrome.

Hamming decoding circuitry 320 may determine based on the computed syndrome and parity information 304 whether (1) there is any data errors in the data portion of retrieved signal 124, (2) there is any forwarded error message (e.g., whether binary error signal 112 indicated occurrence of any errors), (3) there are any uncorrectable or single bit errors that may be corrected. In particular, Hamming decoding circuitry 320 may analyze the values of the syndrome and parity information 304. In some implementations, when the values of the syndrome and parity information 304 are both zero, Hamming decoding circuitry 320 may determine that no error in the data portion of retrieved signal 124 exists and that no forwarded error message was received (e.g., binary error signal 112 was zero or indicated no errors). In this case, Hamming decoding circuitry 320 may output a zero as error index signal 144 and the data portions of retrieved signal 124 as data output signal 118.

In some implementations, when the value of the syndrome is zero and the value of parity information 304 is equal or greater than '1', Hamming decoding circuitry 320 may determine that no error in the data portion of retrieved signal 124 exists, no forwarded error message was received (e.g., binary error signal 112 was zero or indicated no errors) and that only the parity information bit of retrieved signal 124 has an error. In particular, in such a situation, Hamming decoding circuitry 320 may determine that the parity information added by packing circuitry 220 to the extracted portions of codeword signal 202 contained an error. In this case, Hamming decoding circuitry 320 may output a zero as error index signal 144 and the data portions of retrieved signal 124 as data output signal 118.

In some implementations, when the value of the syndrome is non-zero and the value of parity information 304 is zero, Hamming decoding circuitry 320 may determine that there are errors that cannot be corrected (uncorrectable errors) in retrieved signal 124. In particular, in such a situation, Hamming decoding circuitry 320 may determine that either there are two bit errors in retrieved signal 124 (data errors or coding information errors) or that there is one forwarded error message (e.g., binary error signal 112 or encoded error signal 134 indicated the presence of errors) and there exists a data or coding information bit error. In this case, Hamming decoding circuitry 320 may output a non-zero value as error index signal 144 that may be associated with an indication of instability and the data portions of retrieved signal 124 as data output signal 118. In particular, error index signal 144 may be associated with a value that utilization circuitry 150 may use to disregard the received data or request retransmission of the received data due to unrecoverable errors in storage and transmission. More specifically, error index signal 144 may be provided to utilization circuitry 150 in addition to error decoder circuitry 140 (FIG. 1) to allow utilization circuitry 150 to identify when data output 118 is corrupt (e.g., contains uncorrectable errors).

In some implementations, when the value of the syndrome is non-zero and the value of parity information 304 is equal or greater than '1', Hamming decoding circuitry 320 may determine that there exists an error in a single bit of retrieved signal 124. Hamming decoding circuitry 320 may determine whether the value of the syndrome corresponds to a location of one of the coding information bits in retrieved signal 124 (e.g., whether the value of the syndrome is equal to 1, 2, 4, 8, 16, 32 or 64). If the value of the syndrome corresponds to a location of one of the coding information bits, Hamming decoding circuitry 320 may determine that no error in the data portion of retrieved signal 124 exists and that no forwarded error message was received (e.g., binary error signal 112 was zero or indicated no errors). In this case, Hamming decoding circuitry 320 may output a zero as error index signal 144 and the data portions of retrieved signal 124 as data output signal 118.

If the value of the syndrome is less than or equal to 71 (e.g., the length or number of bits minus the parity information bits in retrieved signal 124 (i.e., the extracted portions of codeword signal 202 before the addition of the parity information by packing circuitry 220)), Hamming decoding circuitry 320 may determine that there is a single bit error in the data portion of retrieved signal 124 and that no forwarded error message was received. In this case, Hamming decoding circuitry 320 may flip the bit in retrieved signal 124 at the location corresponding to the syndrome value (e.g., to correct the data bit value in retrieved signal 124), output a zero as error index signal 144, and the data portions of retrieved signal 124 as data output signal 118 with the corrected bit.

If the value of the syndrome is greater than 71 (e.g., the length or number of bits minus the parity information bits in retrieved signal 124 (i.e., the extracted portions of codeword signal 202 before the addition of the parity information by packing circuitry 220)), Hamming decoding circuitry 320 may determine that no error in the data portion of retrieved signal 124 exists and that there was a forwarded error message. In this case, Hamming decoding circuitry 320 may generate a signal that represents a number of bits corresponding to the number of bits represented by encoded error signal 134 and may set all the bits in the generated signal to the value zero except for the bit in the signal at the bit position of the value of the syndrome minus 71 (e.g., the length or number of bits minus the parity information bits in retrieved signal 124 (i.e., the extracted portions of codeword signal 202 before the addition of the parity information by packing circuitry 220)). More specifically, in this case, the syndrome represents the location of the single bit of the encoded error signal 134 that was valued at '1' (e.g., the one-hot signal) and accordingly, Hamming decoding circuitry 320 may recreate encoded error signal 134. Hamming decoding circuitry 320 may output the recreated error signal as error index signal 144 and the data portions of retrieved signal 124 as data output signal 118. The recreated error signal output as error index signal 144 may be used by error decoder circuitry 140 to recover the error information provided by binary error signal 112 (FIG. 1).

Figure 4:
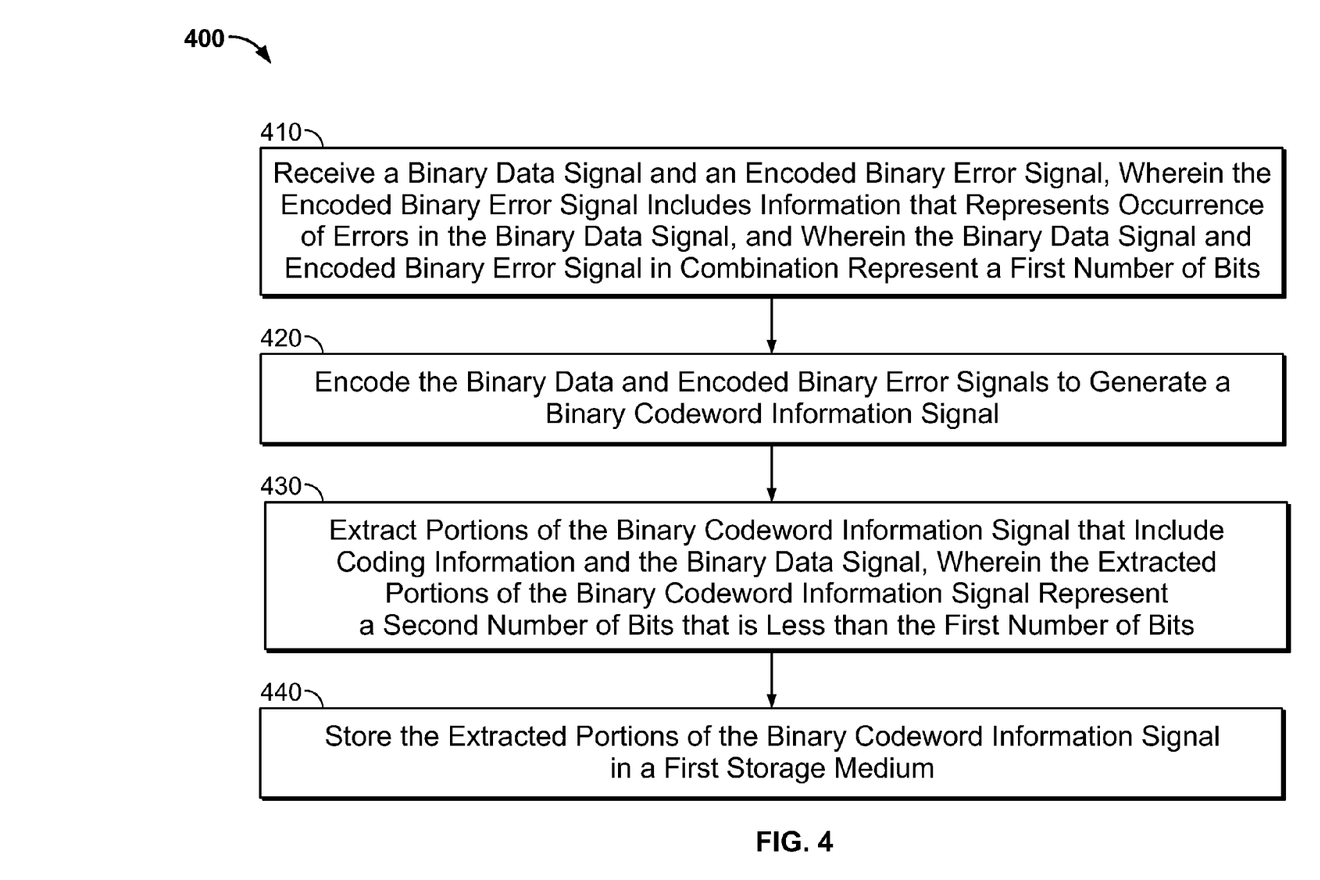
FIG. 4 is an illustrative flow diagram for storing data with encoded error information on a storage medium in accordance with embodiments of the present disclosure.

FIG. 4 is an illustrative flow diagram 400 for storing data with encoded error information on a storage medium in accordance with embodiments of the present disclosure.

At 410, a binary data signal and an encoded binary error signal are received. The encoded binary error signal includes information that represents occurrence of errors in the binary data signal, and the binary data signal and encoded binary error signal in combination represent a first number of bits. For example, memory controller 110 receives binary data signal 114 and binary error signal 112 (FIG. 1). Memory controller 110 encodes binary error signal 112 to generate encoded binary error signal 134. Binary data signal 114 may represent 64-bits of information and binary encoded error signal 114 may represent 56-bits of information (e.g., a total of 120-bits of information). Binary error signal 112 may represent the occurrence of transmission errors or interface errors in binary data signal 114 (e.g., forwarded error information).

At 420, the binary data and encoded binary error signals are encoded to generate a binary codeword information signal. For example, memory controller 110 may perform a linear coding algorithm (e.g., Hamming code) based on binary data signal 114 and encoded binary error signal 134 to generate codeword signal 202 (FIG. 2). Codeword signal 202 includes bits representing coding information, binary data signal 114 and encoded binary error signal 134.

At 430, portions of the binary codeword information signal that include coding information and the binary data signal are extracted. The extracted portions of the binary codeword information signal represent a second number of bits that is less than the first number of bits. For example, packing circuitry 220 extracts from codeword signal 202 the portions that represent the coding information and binary data signal 114 (e.g., the first 71-bits of codeword signal 202 are extracted when the encoded binary error signal 134 is appended to the end of binary data signal 114 in generating codeword signal 202). Packing circuitry 220 may append parity information computed based on codeword signal 202 to the extracted portions to create packed signal 136.

At 440, the extracted portions of the binary codeword information signal are stored in a first storage medium. For example, memory controller 110 stores the packed signal 136 to storage medium 120 (FIG. 1).

Figure 5:
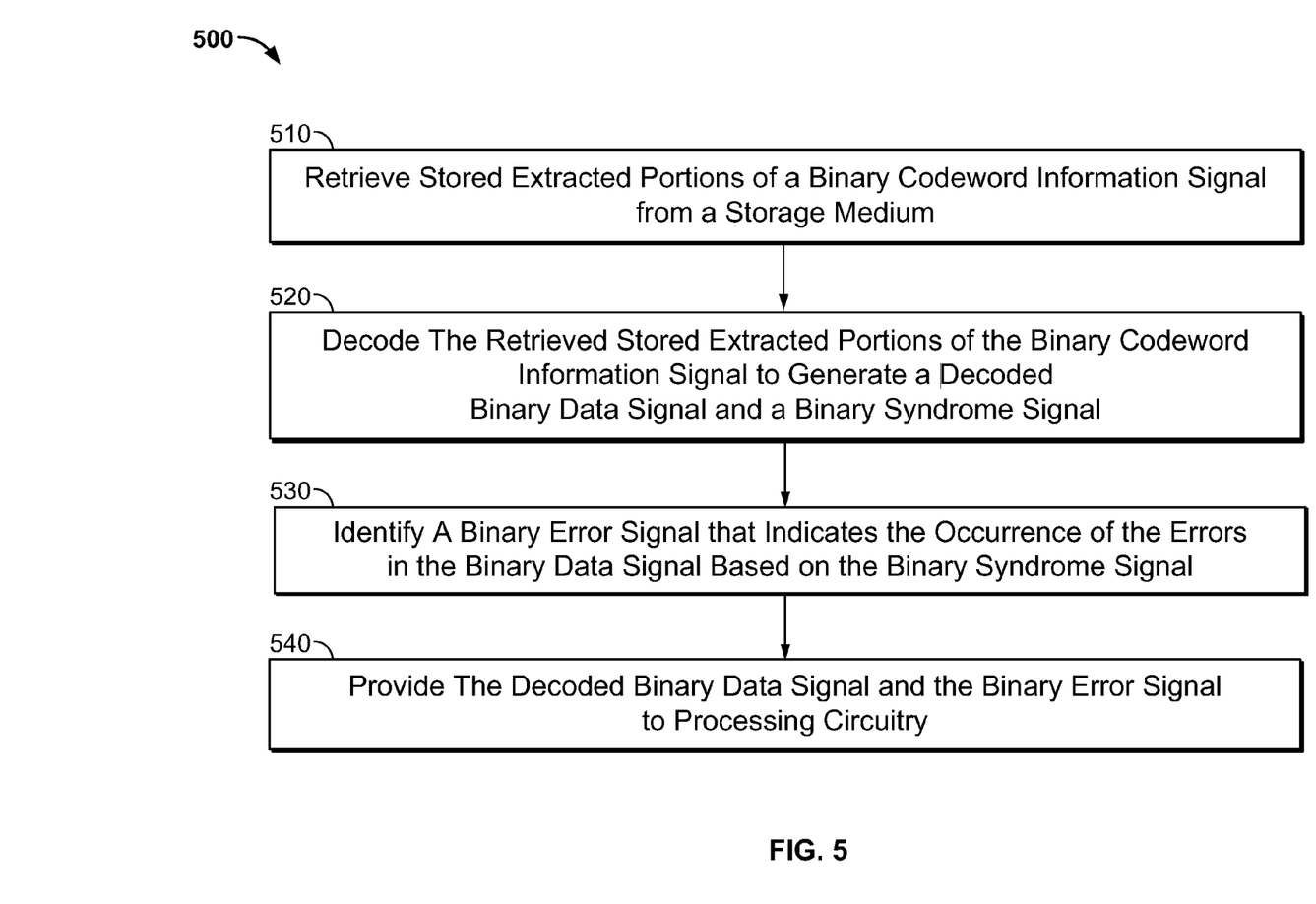
FIG. 5 is an illustrative flow diagram 500 for decoding data stored with encoded error information on a storage medium in accordance with embodiments of the present disclosure.

FIG. 5 is an illustrative flow diagram 500 for decoding data stored with encoded error information on a storage medium in accordance with embodiments of the present disclosure.

At 510, stored extracted portions of a binary codeword information signal are retrieved from a storage medium. For example, decoder and data unpacking circuitry 142 retrieves from storage medium 120 packed signal 136 (FIG. 1). Packed signal 136 includes portions of the codeword signal extracted during the encoding process and parity information generating during the encoding.

At 520, the retrieved stored extracted portions of the binary codeword information signal are decoded to generate a decoded binary data signal and a binary syndrome signal. For example, decoder and data unpacking circuitry 142 may decode packed signal 136 using a linear coding algorithm (e.g., Hamming decoding algorithm) to generate a syndrome which may represent encoded error signal 134 and recover data signal 114.

At 530, a binary error signal that indicates the occurrence of the errors in the binary data signal is identified based on the binary syndrome signal. For example, decoder and data unpacking circuitry 142 may provide the generated binary syndrome signal as error index signal 144 (FIG. 1) to error decoder circuitry 140 to identify recovered error signal 116. Recovered error signal 116 may be the same or similar as binary error signal 112 that identifies errors present in the data signal before the data signal was encoded. Error decoder circuitry 140 may be a look-up table where error index signal 144 is used to determine the address location corresponding to the data of error index signal 144.

At 540, the decoded binary data signal and the binary error signal are provided to processing circuitry. For example, decoder and data unpacking circuitry 142 may output recover data signal 114 as binary data signal 118 to utilization circuitry 150 and error decoder circuitry 140 may output recovered error signal 116 to utilization circuitry 150.

It should be understood that the above steps of the flow diagrams of FIGS. 4 and 5 may be executed or performed in any order or sequence not limited to the order and sequence shown and described in the figures. Also, some of the above steps of the flow diagrams of FIGS. 4 and 5 may be executed or performed substantially simultaneously where appropriate or in parallel to reduce latency and processing times.

The above described embodiments of the present disclosure are presented for purposes of illustration and not of limitation, and the present disclosure is limited only by the claims which follow.

What is claimed is:

1. A method for performing error detection, the method comprising:
   receiving a binary data signal and an encoded binary error signal, wherein the encoded binary error signal includes information that represents occurrence of errors in the binary data signal, and wherein the binary data signal and the encoded binary error signal in combination represent a first number of bits;
   encoding the binary data and encoded binary error signals to generate a binary codeword information signal;
   extracting portions of the binary codeword information signal that include coding information and the binary data signal, wherein the extracted portions of the binary codeword information signal represent a second number of bits that is less than the first number of bits; and
   storing the extracted portions of the binary codeword information signal in a storage medium.

2. The method of claim 1, wherein receiving the encoded binary error signal comprises:
   receiving a binary error signal that includes information corresponding to forwarded error information and parity information associated with the binary data signal; and
   encoding the binary error signal to generate a one-hot signal as the encoded binary error signal.

3. The method of claim 2, wherein the storage medium is a first storage medium, and wherein encoding the binary error signal comprises:
   retrieving from a second storage medium the one-hot signal based on an address location corresponding to the binary error signal, wherein the second storage medium comprises a look-up table.

4. The method of claim 1, wherein encoding the binary data and encoded binary error signals comprises:
   performing a linear error-correcting code algorithm on the binary data and encoded binary error signals.

5. The method of claim 1, wherein extracting portions of the binary codeword information signal comprises:
   computing parity information based on the binary codeword information signal;
   retrieving a first number of bits of the codeword information signal that include bits of the binary data signal interleaved with bits of the coding information; and
   adding the parity information bit to a signal resulting from the retrieving.

6. The method of claim 1 further comprising:
   retrieving the stored extracted portions of the binary codeword information signal from the storage medium; and
   decoding the retrieved extracted portions of the binary codeword information signal using a linear error-correcting code algorithm to provide a decoded binary data signal and a binary syndrome signal.

7. The method of claim 6, wherein the decoding further comprises obtaining a parity information bit included in the retrieved extracted portions of the binary codeword information signal.

8. The method of claim 7 further comprising:
   processing the binary syndrome signal and the parity information bit to detect (1) whether errors occurred after the binary data signal and an encoded binary error signal have been received and (2) whether the encoded coded binary error signal represented occurrence of errors in the binary data signal.

9. The method of claim 8, wherein the storage medium is a first storage medium, further comprising:
   when the processing detects that the encoded binary error signal represented occurrence of errors in the binary data signal, retrieving from a storage location in a second storage medium, based on a value represented by the binary syndrome signal, a recovered error information signal that corresponds to a binary error signal received prior to the encoding, wherein the recovered error information signal includes previously received forwarded error information and parity information associated with the decoded binary data signal.

10. The method of claim 1 further comprising:
    retrieving the stored extracted portions of the binary codeword information signal from the storage medium;
    decoding the retrieved stored extracted portions of the binary codeword information signal to generate a decoded binary data signal and a binary syndrome signal;
    identifying a binary error signal that indicates the occurrence of the errors in the binary data signal based on the binary syndrome signal; and
    providing the decoded binary data signal and the binary error signal to processing circuitry.

11. A system for performing error detection, the system comprising:
    encoder circuitry configured to:
       receive a binary data signal and an encoded binary error signal, wherein the encoded binary error signal includes information that represents occurrence of errors in the binary data signal, and wherein the binary data signal and encoded binary error signal in combination represent a first number of bits;
       encode the binary data and encoded binary error signals to generate a binary codeword information signal;
       extract portions of the binary codeword information signal that include coding information and the binary data signal, wherein the extracted portions of the binary codeword information signal represent a second number of bits that is less than the first number of bits; and
    processing circuitry configured to store the extracted portions of the binary codeword information signal in a storage medium.

12. The system of claim 11, wherein the encoder circuitry is a first encoder circuitry, further comprising second encoder circuitry configured to:
    receive a binary error signal that includes information corresponding to forwarded error information and parity information associated with the binary data signal; and
    encode the binary error signal to generate a one-hot signal as the encoded binary error signal.

13. The system of claim 12, wherein the storage medium is a first storage medium, and wherein the second encoder circuitry comprises:
a second storage medium that includes a look-up table;
wherein the second encoder circuitry is further configured to retrieve from the second storage medium the one-hot signal based on an address location corresponding to the binary error signal.

14. The system of claim 11, wherein the encoder circuitry is further configured to:
perform a linear error-correcting code algorithm on the binary data and encoded binary error signals to generate the binary codeword information signal.

15. The system of claim 11, wherein the encoder circuitry is further configured to extract the portions of the binary codeword information signal by:
computing parity information based on the binary codeword information signal;
retrieving a first number of bits of the codeword information signal that include bits of the binary data signal interleaved with bits of the coding information; and
adding the parity information bit to the signal resulting from the retrieving.

16. The system of claim 11 further comprising decoder circuitry configured to:
retrieve the stored extracted portions of the binary codeword information signal from the storage medium; and
decode the retrieved extracted portions of the binary codeword information signal using a linear error-correcting code algorithm to provide a decoded binary data signal and a binary syndrome signal.

17. The system of claim 16, wherein the decoder circuitry is further configured to obtain a parity information bit included in the extracted portions of the binary codeword information signal.

18. The system of claim 17 wherein the processing circuitry is further configured to:
process the binary syndrome signal and the parity information bit to detect (1) whether errors occurred after the binary data signal and an encoded binary error signal have been received and (2) whether the encoded coded binary error signal represented occurrence of errors in the binary data signal.

19. The system of claim 18, wherein the storage medium is a first storage medium, further comprising:
a second storage medium;
wherein the processing circuitry is further configured to retrieve from a storage location in the second storage medium, based on a value represented by the binary syndrome signal, a recovered error information signal that corresponds to a binary error signal received prior to the encoding, wherein the recovered error information signal includes previously received forwarded error information and parity information associated with the decoded binary data signal.

20. The system of claim 11 further comprising decoding circuitry configured to:
retrieve the stored extracted portions of the binary codeword information signal from the storage medium;
process the retrieved stored extracted portions of the binary codeword information signal to generate a decoded binary data signal and a binary syndrome signal;
identify a binary error signal that indicates the occurrence of the errors in the binary data signal based on the binary syndrome signal; and
provide the decoded binary data signal and the binary error signal to the processing circuitry.

\* \* \* \* \*